United States Patent
Veloso et al.

(10) Patent No.: US 11,088,263 B2
(45) Date of Patent: Aug. 10, 2021

(54) METHOD OF FORMING VERTICAL FIELD EFFECT TRANSISTOR DEVICE

(71) Applicant: IMEC vzw, Leuven (BE)

(72) Inventors: Anabela Veloso, Leuven (BE); Geert Eneman, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/893,233

(22) Filed: Jun. 4, 2020

(65) Prior Publication Data
US 2020/0388698 A1    Dec. 10, 2020

(30) Foreign Application Priority Data
Jun. 5, 2019   (EP) .................................... 19178418

(51) Int. Cl.
*H01L 29/66*    (2006.01)
*H01L 29/16*    (2006.01)
*H01L 29/417*   (2006.01)

(52) U.S. Cl.
CPC ........ *H01L 29/66666* (2013.01); *H01L 29/16* (2013.01); *H01L 29/41741* (2013.01); *H01L 29/66553* (2013.01)

(58) Field of Classification Search
CPC ............. H01L 29/0696; H01L 29/1095; H01L 29/7375; H01L 29/7393–7395;
(Continued)

(56) References Cited
U.S. PATENT DOCUMENTS 9,755,073 B1    9/2017  Cheng et al.
9,870,957 B2 *  1/2018  Jeong .................... H01L 23/535
(Continued)

OTHER PUBLICATIONS

Extended European Search Report dated Nov. 13, 2019 in counterpart Application No. EP 19178418.0.

*Primary Examiner* — Mohammad M Hoque
(74) *Attorney, Agent, or Firm* — Knobbe, Martens, Olson & Bear, LLP

(57) ABSTRACT

The disclosed technology relates generally to semiconductor processing and more particularly to a method of forming a vertical field-effect transistor device. According to an aspect, a method of forming a vertical field-effect transistor device comprises forming on a substrate a vertical semiconductor structure protruding above the substrate and comprising a lower source/drain portion, an upper source/drain portion and a channel portion arranged between the lower source/drain portion and the upper source/drain portion. The method additionally comprises forming on the channel portion an epitaxial semiconductor stressor layer enclosing the channel portion, wherein the stressor layer and the channel portion are lattice mismatched, forming an insulating layer and a sacrificial structure, wherein the sacrificial structure encloses the channel portion with the stressor layer formed thereon and wherein the insulating layer embeds the semiconductor structure and the sacrificial structure, forming in the insulating layer an opening exposing a surface portion of the sacrificial structure, and etching the sacrificial structure through the opening in the insulating layer, thereby forming a cavity exposing the stressor layer enclosing the channel portion. The method further comprises, subsequent to etching the sacrificial structure, etching the stressor layer in the cavity, and subsequent to etching the stressor layer, forming a gate stack in the cavity, wherein the gate stack encloses the channel portion of the vertical semiconductor structure.

17 Claims, 4 Drawing Sheets

(58) Field of Classification Search
CPC ........... H01L 29/7397; H01L 29/66325; H01L 29/66333–66348; H01L 27/11553–11556; H01L 27/1158–11582; H01L 27/11273; H01L 29/66712–66734; H01L 29/7802–7815; H01L 29/7812; H01L 29/7824; H01L 29/66666; H01L 29/16; H01L 29/41741; H01L 29/66553; H01L 29/7827; H01L 29/66545; H01L 29/161; H01L 21/2825
USPC ........................................................ 438/149
See application file for complete search history.

(56) References Cited

U.S. PATENT DOCUMENTS

| | | | |
|---|---|---|---|
| 10,014,372 B1 | 7/2018 | Leobandung | |
| 10,170,376 B1* | 1/2019 | Hung | H01L 21/02603 |
| 10,755,937 B2* | 8/2020 | Shen | H01L 21/02532 |
| 2009/0166725 A1 | 7/2009 | Lee | |
| 2013/0270628 A1 | 10/2013 | Huang et al. | |
| 2015/0048294 A1 | 2/2015 | Park | |
| 2016/0064541 A1* | 3/2016 | Diaz | H01L 27/092 |
| | | | 257/329 |
| 2016/0240623 A1* | 8/2016 | Chang | H01L 29/7827 |
| 2017/0222045 A1* | 8/2017 | Leobandung | H01L 21/823487 |
| 2018/0006024 A1* | 1/2018 | Anderson | H01L 29/66666 |
| 2018/0006118 A1* | 1/2018 | Mallela | H01L 29/7827 |
| 2018/0083121 A1* | 3/2018 | Suvarna | H01L 29/66666 |
| 2018/0108776 A1 | 4/2018 | Survana | |
| 2018/0331202 A1* | 11/2018 | Li | H01L 29/401 |
| 2019/0363026 A1* | 11/2019 | Lee | H01L 27/092 |

* cited by examiner

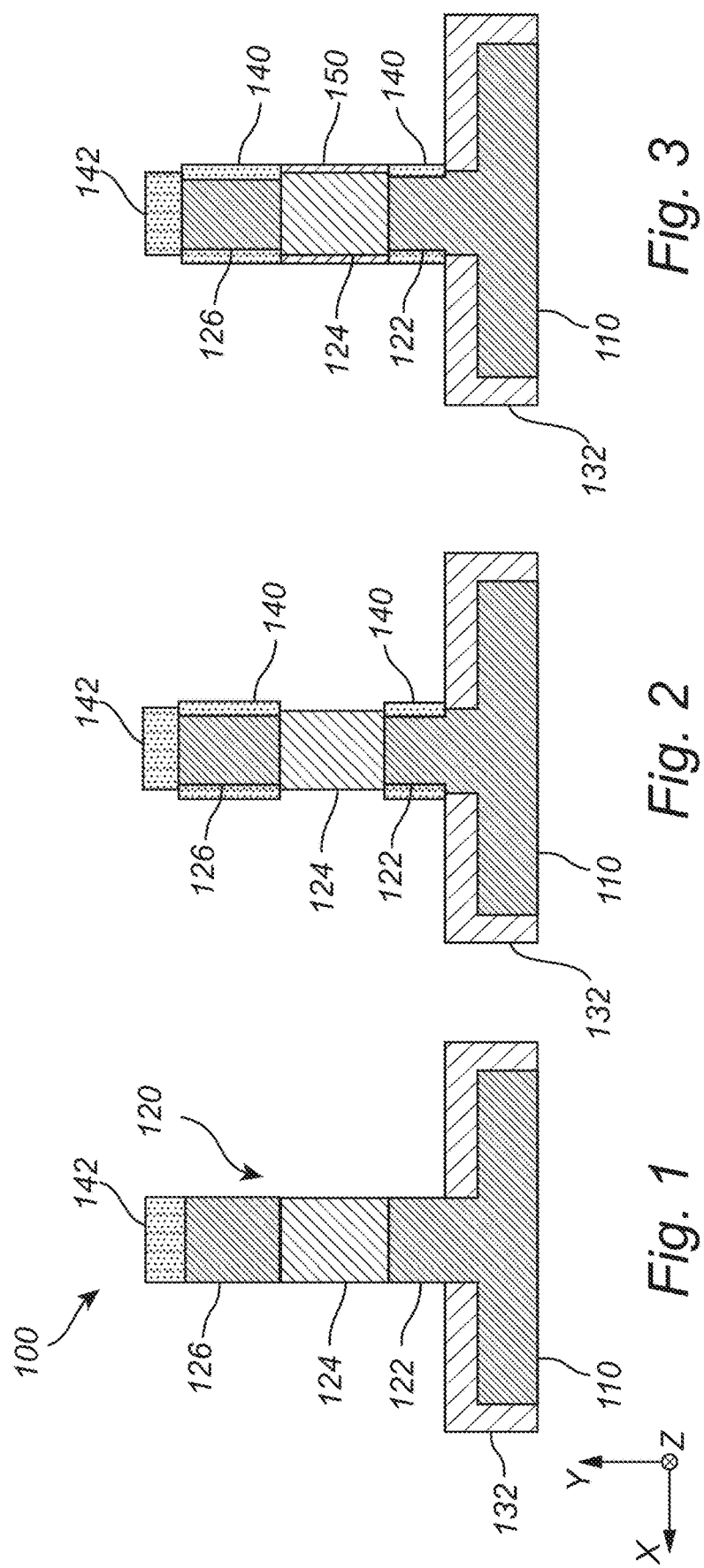

METHOD OF FORMING VERTICAL FIELD EFFECT TRANSISTOR DEVICE

CROSS-REFERENCE TO RELATED APPLICATIONS

This application claims foreign priority to European Application No. EP 19178418.0, filed Jun. 5, 2019, the content of which is incorporated by reference herein in its entirety.

BACKGROUND

Field

The disclosed technology relates generally to semiconductor processing and more particularly to a method of forming a vertical field-effect transistor device.

Description of the Related Technology

A vertical field effect transistor (VFET) is a device comprising a vertical semiconductor structure, such as a vertical nanowire or nanosheet, protruding above the substrate. The VFET has a vertically oriented channel defined in a channel portion of the semiconductor structure, the channel portion extending between a lower source/drain portion and an upper source/drain portion. A VFET may hence be referred to as a vertical channel device. The gate of the VFET extends around the channel portion, typically in an all-around fashion. In contrast to horizontal channel devices such as planar FETs and finFETs, where a gate length can defined by the line width of the gate, a gate length of a VFET can be defined along the thickness direction of the gate layer. For this reason, among others, the VFET can be an enabler for dense circuit implementations. Thus, there is a continuing need to improve VFET performance as well as manufacturing techniques thereof.

SUMMARY OF CERTAIN INVENTIVE ASPECTS

An objective of the present inventive concept is to address, among other things, the above-mentioned need. Further and alternative objectives may be understood from the following.

According to an aspect of the disclosed technology a method of forming a vertical field-effect transistor device comprises: forming on a substrate a vertical semiconductor structure protruding above the substrate and comprising a lower source/drain portion, an upper source/drain portion and a channel portion arranged between the lower source/drain portion and the upper source/drain portion; forming on the channel portion an epitaxial semiconductor stressor layer enclosing the channel portion, wherein the stressor layer and the channel portion are lattice mismatched; forming an insulating layer and a sacrificial structure, wherein the sacrificial structure encloses the channel portion with the stressor layer formed thereon and wherein the insulating layer embeds the semiconductor structure and the sacrificial structure; forming in the insulating layer an opening exposing a surface portion of the sacrificial structure; etching the sacrificial structure through the opening in the insulating layer, thereby forming a cavity exposing the stressor layer enclosing the channel portion; subsequent to etching the sacrificial structure, etching the stressor layer in the cavity; and subsequent to etching the stressor layer, forming a gate stack in the cavity, the gate stack enclosing the channel portion of the vertical semiconductor structure.

The disclosed technology allows providing a lattice-mismatched heterojunction between the channel portion and the stressor layer. Thereby, strain may be applied to the channel portion. By etching the stressor layer prior to forming the gate stack, the stressor layer may be reduced in thickness, or preferably such that the channel portion is exposed. Hence, advantageously, the stressor layer neither results in significant increase in cross-sectional dimension of the channel portion, nor an associated reduction of channel control. In various embodiments, due to presence of the embedding insulating layer, at least some of the strain introduced by the stressor layer may be preserved in the channel portion even after the etching of the stressor layer. The presence of the strain in the channel portion may hence increase carrier mobility in the channel of the obtained VFET device.

In some embodiments, the insulating layer may comprise a lower insulating layer portion, formed prior to the sacrificial structure, embedding the lower source/drain portion at least partly and exposing the channel portion. The insulating layer may further comprise an upper insulating layer portion, formed subsequent to the sacrificial structure, embedding the sacrificial structure and the upper source/drain portion at least partly. The sacrificial structure may be formed on the lower insulating layer portion. Thereby, the sacrificial structure may be embedded or surrounded both vertically and laterally by the insulating layer. By forming the sacrificial structure subsequent to the lower insulating layer, the final gate structure may be electrically insulated from the substrate below.

In some embodiments, forming the sacrificial structure may comprise depositing a sacrificial layer on the lower insulating layer portion, and patterning the sacrificial layer to define the sacrificial structure prior to forming the upper insulating layer portion. Thereby, the patterning of the sacrificial layer into the sacrificial structure may enable formation of the sacrificial structure with desired dimensions. As may be appreciated, the sacrificial structure may hence be formed as a sacrificial gate structure or a dummy gate structure.

In some embodiments, the opening formed in the insulating layer may be formed in the upper insulating layer portion. The opening may be formed by etching the upper insulating layer until exposing an upper surface of the sacrificial structure.

In some embodiments, the channel portion may comprise $Si_{1-x}Ge_x$ and the stressor layer may comprise $Si_{1-y}Ge_y$, wherein x differs from y. Depending on whether x is smaller or greater than y, either compressive or tensile strain may be introduced into the channel portion. Advantageously, for fabrication of an n-type VFET, x may be smaller than y. A higher Ge content of the stressor layer (y) than the channel portion (x) may provide a lattice-mismatched heterojunction between the channel portion and the stressor layer introducing tensile strain. The amount and type of strain introduced into the channel portion may more generally be tuned by controlling the relative compositions of the channel portion and the stressor layer.

In some embodiments, the lower source/drain portion may comprise $Si_{1-a}Ge_a$ and the upper source/drain portion may comprise $Si_{1-b}Ge_b$, wherein a and b differ from x. This allows selective processing of the channel and source/drain portions. It may further allow introducing different amounts of strain in the channel portion and the source portion and/or drain portion, if the stressor layer is formed on also the source portion and/or drain portion.

In some embodiments, the Ge content a and b may be equal to each other or different.

In some embodiments, the Ge content of the source/drain portions may be greater than the Ge content of the channel portion, i.e., a>x and b>x. An advantage brought about by having a higher Ge content in the lower and upper source/drain portions than in the channel portion is that even if the stressor layer is formed on all three portions of the vertical semiconductor structure, a greater strain may be provided to the channel portion.

In some embodiments, the method may further comprise, prior to forming the sacrificial structure, reducing a cross-sectional dimension of the channel portion by etching the channel portion selectively to the upper and lower source/drain portions. Thereby, channel control of the VFET device may be further improved. Reducing the cross-sectional dimensions of the channel portion (sometimes referred to as "trimming" the channel portion) may further facilitate introducing strain in to a greater part of the channel portion.

In some embodiments, the method may further comprise, prior to forming the insulating layer and the sacrificial structure, forming a spacer on peripheral surfaces of the lower and upper source/drain portions. Thereby, the spacers may counteract formation of the stressor layer on the lower and upper source/drain portions and may hence enable selective formation of the stressor layer on only the channel portion.

In some embodiments, forming the spacer may comprise subjecting the vertical semiconductor structure to an oxidation process, thereby forming an oxide layer on peripheral surfaces of the lower and upper source/drain portions, such that the lower and upper source/drain portions may be provided with thicker oxide layer portions than the channel portion. The method may subsequently comprise etching the oxide layer to expose the channel portion while preserving at least some of the oxide layer at the lower and upper source/drain portions.

In some embodiments, the thicker oxide layer on the lower and upper source/drain portions than the channel portion may be achieved due to the higher oxidation rate of the lower and upper source/drain portions than the channel portion. The higher oxidation rate of the lower and upper source/drain portions than the channel portion may be provided by a higher Ge contents of them. Thereby, a compositional tuning of the lower source/drain portion, the channel portion and the upper source/drain portion may advantageously facilitate formation of the spacers on the lower and upper source/drain portions to counteract the stressor layer formation thereon.

In some embodiments, the method may further comprise, subsequent to forming the spacer, reducing a cross-sectional dimension of the channel portion by etching the channel portion selectively to the upper and lower source/drain portions, and subsequently forming the stressor layer enclosing the channel portion of the reduced cross-sectional dimension. Thereby the spacer may advantageously be used to counteract reduction of the cross-sectional dimension of the lower and upper source/drain portions and hence enable a highly selective reduction of the cross-sectional dimension of the channel portion with respect to the lower and upper source/drain portions. The reduction of the cross-sectional dimension of the channel portion may allow further improved channel control of the VFET device and further facilitate introducing a greater amount of strain in the channel portion.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

FIGS. 1-9 schematically illustrate intermediate structures at various stages of fabricating a vertical field-effect transistor device, according to various embodiments.

DETAILED DESCRIPTION OF CERTAIN ILLUSTRATIVE EMBODIMENTS

Figure 4:
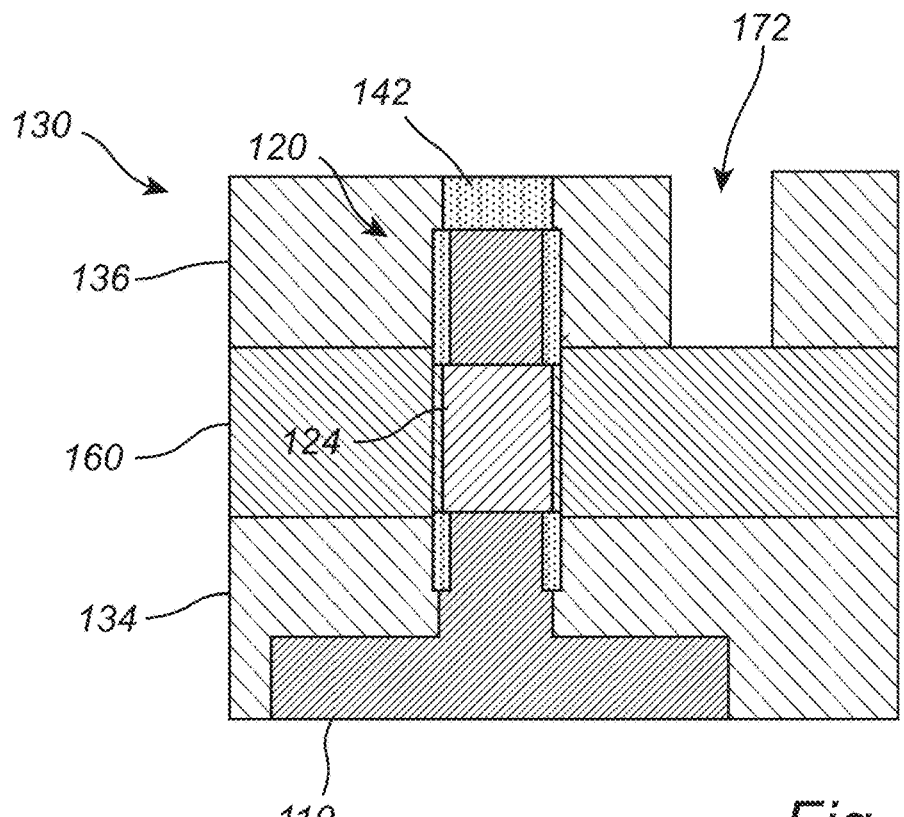

As described above, vertical field effect transistors (VFETs) can offer various advantages for continued scaling of complementary metal oxide semiconductor (CMOS) devices. Strain engineering aims to improve device performance, e.g., carrier mobility, by inducing strain on, e.g., the semiconductor channel portion of a transistor. Although much attention has gone into development of strain engineering techniques for horizontal channel devices, there is a need for novel strain engineering techniques for VFETs. In various aspects of the technology disclosed herein, strain-engineered VFETs and methods of fabricating the same provide various performance and fabrication advantages.

Various methods for forming a vertical field-effect transistor device will now be disclosed in connection with FIGS. 1-9.

FIG. 1 shows a cross-sectional view of an initial structure 100 of a method according to various embodiments. The structure 100 comprises a vertical semiconductor structure 120 which protrudes above a substrate 110. In FIG. 1, the axis Y denotes a vertical direction corresponding to a normal direction with respect to an upper surface of the substrate 110. The axis X denotes a first horizontal direction along the substrate 110 and the axis Z denotes a second horizontal direction along the substrate 110, perpendicular to the first direction X. It should be noted that in the drawings the relative dimensions of the shown elements, such as the height, width or thickness of elements, is merely schematic and may, for the purpose of illustrational clarity, differ from a physical structure.

In FIG. 1 and the following figures, one vertical semiconductor structure 120 is shown. However, it should be noted that there may be any number of further vertical semiconductor structures 120 above the substrate 110 (outside the illustrated region). The vertical semiconductor structure 120 extends in parallel to the Y direction. By way of example, a typical height of the vertical semiconductor structure 120 may be in a range from 10 to 200 nm. The width of the vertical semiconductor structure 120 (i.e. along the X axis) may be in a range from 3 to 100 nm. The width of a vertical semiconductor structure 120 in the second horizontal direction (i.e., along the Z axis) may be in a range from 3 to 100 nm, e.g., depending on whether a nanowire-shaped or nanosheet-shaped structure is desired.

The substrate 110 may be any suitable substrate 110, such as a substrate suitable for complementary metal-oxide semiconductor (CMOS) processing. The substrate 110 may, for instance, be a semiconductor substrate such as a Si substrate, a Ge substrate or a silicon-germanium (SiGe) substrate. Other examples include a silicon-on-insulator (SOI) substrate, a GeOI substrate or a SiGeOI substrate.

The vertical semiconductor structure 120 comprises a lower source/drain portion 122, an upper source/drain portion 126 and a channel portion 124 arranged between the lower and upper source/drain portion 122, 126. The lower source/drain portion 122, the channel portion 124 and the upper source/drain portion 126 form a stack of three segments along the Y direction. The lower source/drain portion 122, the channel portion 124 and the upper source/drain portion 126 may have the same or different height/thickness. A typical height of the lower and upper source/drain portions 122, 126 may be in a range from 5 to 50 nm. A typical height of the channel portion may be in a range from 6 to 100 nm.

The channel portion 124 may be formed of Si or a $Si_{1-x}Ge_x$ alloy with a low Ge content such as x being in a range from 0 to 20%. The lower source/drain portion 122 may be formed of $Si_{1-a}Ge_a$ alloy where a may be greater than x. As an example a may be in a range of 20%-80%. The upper source/drain portion 126 may be formed of $Si_{1-b}Ge_b$ alloy where b may be greater than x. As an example b may be in a range of 20%-80%. Embodiments are not so limited, however, and the channel portion 124 may be formed with a greater Ge-content than the source/drain portions 122, 126. For example, the channel portion 124 may be formed of $Si_{1-x}Ge_x$ with x in a range from 80 to 100%, and the lower and upper source/drain portions being formed of $Si_{1-a}Ge_a$ and $Si_{1-b}Ge_b$ respectively, where a and b are in a range from 0 to 20%.

The vertical semiconductor structure 120 may be formed in a suitable manner, e.g., by etching an epitaxial semiconductor layer stack formed on the substrate 110, the layer stack comprising a lower source/drain layer, a channel layer and an upper source/drain layer. The layer stack may be formed using any suitable technique, such as chemical vapor deposition (CVD), metalorganic CVD (MOCVD), molecular beam epitaxy (MBE) or vapor phase epitaxy (VPE). Reference sign 142 in FIG. 1 signifies a mask which may remain after the patterning of the semiconductor structure 120. The mask 142 may for instance be a hard mask or an oxide mask. The mask 142 may protect the upper surface of the upper source/drain portion 126 during subsequent method steps, to be described below.

Subsequent to forming the vertical semiconductor structure 120, a bottom portion of the vertical semiconductor structure 120 may be embedded in a bottom insulating layer 132. The bottom insulating layer 132 may cover the substrate 110 in regions adjacent to and in between the vertical semiconductor structure(s) 120. An insulating material, e.g., an oxide material such as silicon dioxide or a low-k dielectric material, may be deposited and etched back to define a layer having a suitable thickness. The bottom insulating layer 132 may, for instance, form a shallow-trench-insulation (STI), embedding lower portions of vertical semiconductor structure(s) 120. The insulating layer may be formed, for instance, using CVD.

In FIG. 2, a spacer 140 has been formed on peripheral surfaces of the lower and upper source/drain portions 122, 126 of the vertical semiconductor structure 120. The spacer 140 may be formed by subjecting the vertical semiconductor structure 120 to an oxidation process in which an oxide layer is formed.

As disclosed above, the channel portion 124 may be formed of a different material than the lower and upper source/drain portions 122, 126. For instance, since a greater Ge-content has shown to increase a rate of oxidization (e.g., at temperatures between 400° C. and 700° C.) forming the lower and upper source/drain portions 122, 126 with a greater Ge-content than the channel portion 124 enables a selective or at least preferential oxidation of the lower and upper source/drain portions 122, 126, such that a thicker oxide layer may be formed on the lower and upper source/drain portions 122, 126 than the channel portion 124. The oxide may thus be formed at a temperature and pressure selected such that the thickness of the oxide is growing faster on the lower and upper source/drain portions 122, 126 than on the channel portion 124. In this way, a thicker spacer layer may be produced on the peripheral surfaces of the lower and upper source/drain portions 122, 126, and a relatively thin spacer layer, or no spacer layer at all, formed on the peripheral surfaces of the channel portion 124. A uniform etch of the spacer layer may result in an etch back of the spacer layer such that the peripheral surface of the channel portion 124 is exposed, e.g., by completely removing the relatively thin spacer layer from the surfaces of the channel portion 124, while a (thinned) spacer layer remains on the peripheral surfaces of the lower and upper source/drain portions 122, 126. It is contemplated that spacers 140 may be formed on the lower and upper source/drain portions 122, 126 using other techniques, such as selective dielectric deposition.

The method proceeds by forming on the channel portion 124 an epitaxial semiconductor stressor layer 150, as shown in FIG. 3. The stressor layer 150 may enclose the channel portion 124 by covering a peripheral surface of the channel portion 124. The stressor layer 150 is formed to be lattice mismatched with respect to the channel portion 124. The lattice mismatch induces strain in the lattice structure of the channel portion 124. The type of strain (e.g., tensile or compressive strain) may generally depend on the relative compositions of the stressor layer 150 and the channel portion 124. If the stressor layer 150 has a greater Ge-content than the channel portion 124, tensile strain may be induced in the channel portion 124. Tensile strain may be desired for fabrication of n-type VFETs. If the stressor layer 150 has a lower Ge-content than the channel portion 124, compressive strain may be induced in the channel portion 124. Compressive strain may be desired for fabrication of p-type VFETs. The net direction of the strain may typically be oriented in a vertically upward or downward direction.

As illustrated in FIG. 3, in some implementations, no stressor layer 150 has been formed on the lower and the upper source/drain portions 122, 126. Such selective deposition of the stressor layer 150 on the channel portion 124 can occur, e.g., when the presence of the spacer 140 counteracts formation of the stressor layer 150 on the lower and upper source/drain portions 122, 126. However, embodiments are not so limited and in some other implementations, a stressor layer 150 having a smaller thickness than that on the lower and upper source/drain portions 122, 126 may be present.

The epitaxial semiconductor stressor layer may be formed, for instance, by using MBE or standard CVD. The stressor layer 150 may be formed of $Si_{1-y}Ge_y$ alloy wherein y may be in a range of 20%-80%, however in any case different from the composition of the channel layer 124. The stressor layer 150 may for instance be formed with a thickness in a range of 1 to 10 nm. The composition of the stressor layer 150 may be determined by, e.g., selecting appropriate precursors controlling epitaxial growth parameters, e.g., flows and temperature.

The method proceeds by forming an insulating layer 130 and a sacrificial structure 160, as shown in FIG. 4. FIG. 4 shows that the insulating layer 130 has embedded the semiconductor structure 120 and the sacrificial structure 160.

The insulating layer 130 may comprise a lower insulating layer portion 134 and an upper insulating layer portion 136.

The lower insulating layer 134 may be formed prior to the sacrificial structure 160. The lower insulating layer portion 134 may completely or at least partly embed the lower source/drain portion 122 while exposing the channel portion 124. As suggested by FIG. 4, the lower insulating layer portion 134 may be formed of the same material as the bottom insulating layer 132, such that they may form a common lower insulating layer 134. However, it would also be possible to form the lower insulating layer portion 134 of a material different than the bottom insulating layer 132. The lower insulating layer portion 134 may be formed in a similar manner as the bottom insulating layer 132, e.g., by depositing insulating material and subsequently performing an etch back of the deposited insulating material such that an upper surface of the lower insulating layer portion 134 may correspond at least roughly to a level of the interface between the lower source/drain portion 122 and the channel portion 124.

The sacrificial structure 160 may be formed subsequent to the lower insulating layer portion 134. The sacrificial structure 160 may be formed on the lower insulating layer portion 134. FIG. 4 shows that the sacrificial structure 160 encloses the channel portion 124 with the stressor layer 150 formed thereon. The sacrificial structure 160 may be formed by depositing a sacrificial layer on the lower insulating layer portion 134, for instance a layer of amorphous Si. However, some other suitable material, which may be removed selectively from the spacer 140 material and the insulating layer 130, would also be possible. The sacrificial layer may subsequently be patterned to define the sacrificial structure 160. Preferably, the sacrificial structure 160 may be defined with dimensions corresponding to desired dimensions of a final gate structure, which is to be formed.

The upper insulating layer portion 136 may be formed subsequent to the sacrificial structure 160. The upper insulating layer portion 136 may completely embed and cover the sacrificial structure 160. The upper insulating layer portion 136 may also embed the upper source/drain portion 126. The upper insulating layer portion 136 may be formed in a similar manner, and also by a same material as the lower insulating layer portion 134. Insulating material may be deposited to embed and cover the sacrificial structure 160 and the upper source/drain portion 126. The deposited insulating material may subsequently be planarized (e.g., by CMP) and etched back to become co-planar with an upper surface of the mask 142.

FIG. 4 shows that an opening 172 has been formed in the insulating layer 130. The opening 172 exposes a surface portion of the sacrificial structure 160, e.g., an upper surface portion as shown. The opening 172 of FIG. 4 has been formed in the upper insulating layer portion 136. The opening 172 may be formed, e.g., by etching the upper insulating layer 136 through a lithographically patterned etch mask.

Figure 5:
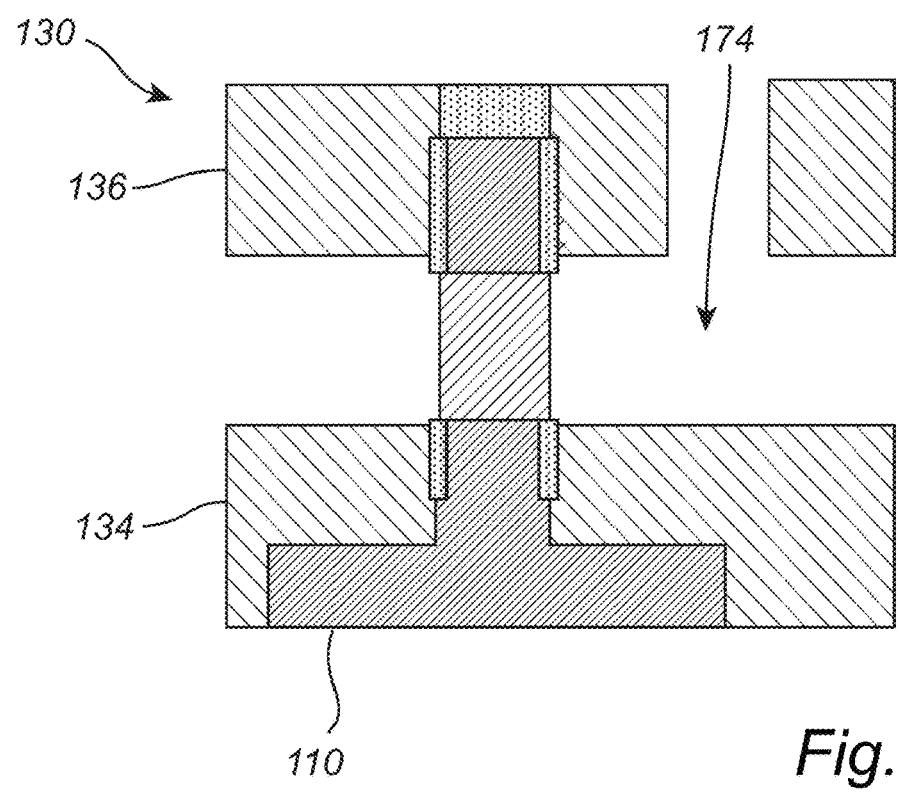

As shown in FIG. 4, the opening 172 provides access to the sacrificial structure 160 and the method proceeds by etching the sacrificial structure 160 through the opening 172 in the insulating layer 130. FIG. 5 shows that the sacrificial structure 160 has been removed selectively with respect to the lower and upper insulating layer portions 134, 136, to form a cavity 174 within the insulating layer 130. The etching of the sacrificial structure 160 proceeds until the stressor layer 150 enclosing the channel portion 124 is exposed. The etching of the sacrificial structure 160 may be performed in a wet or vapor etching process. For instance, a wet etching process using tetramethylammonium hydroxide (TMAH) may be performed at a temperature higher than room temperature, e.g. 80° C., to etch the sacrificial structure 160. Examples of dry etching processes include processes that use $SF_6$- or $CF_4$-based plasmas.

The method further proceeds by etching the stressor layer 150 in the cavity 174, subsequent to etching the sacrificial structure 160. As shown in FIG. 5, the stressor layer 150 may be removed to expose the peripheral surface of the channel portion 124. As the lower and upper source/drain portions 122, 126 remain tethered by the embedding insulating layer 130, the strain in the channel portion 124 may be preserved also following the removal of the stressor layer 150. Although shown to be completely removed in FIG. 5, it is also possible to only partially reduce a thickness of the stressor layer 150 such that a stressor layer 150 of a reduced thickness remain on the channel portion 150. Advantageously, an etching process allowing the stressor layer 150 to be etched selectively from the channel portion 124 may be used. However, a non-selective etching is also viable by timing the etching process appropriately.

Figure 6:
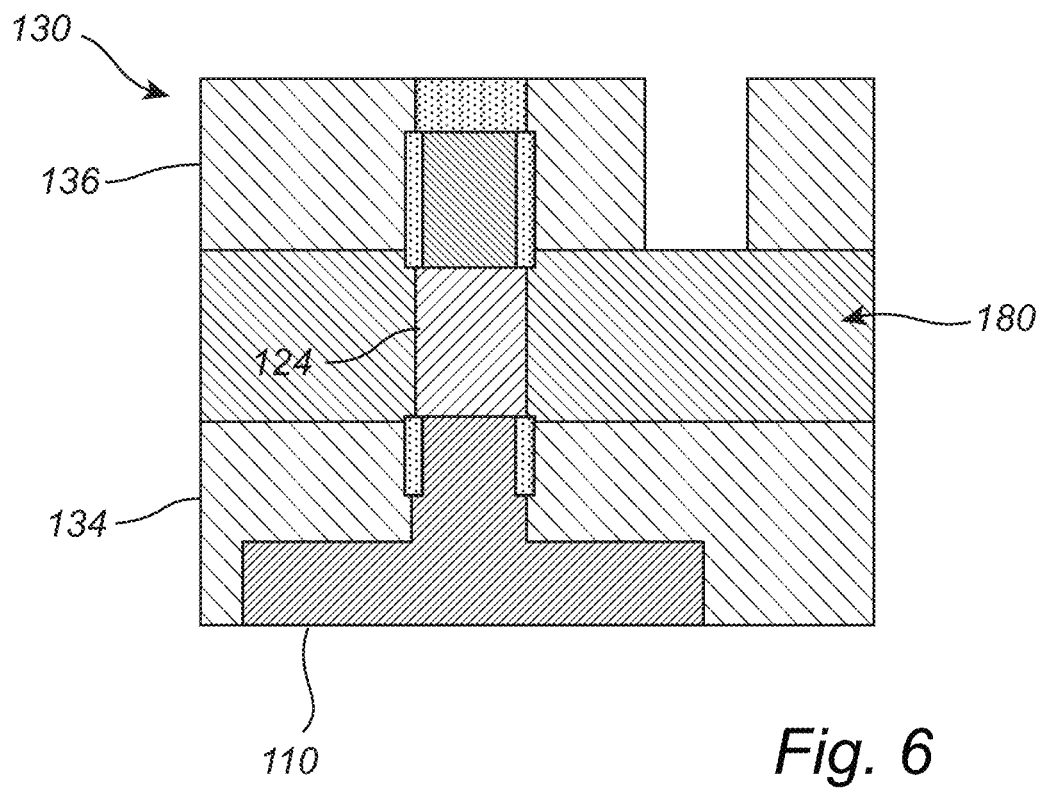

In any case, the method may further proceed by forming a gate stack 180 in the cavity 174 subsequent to the etching of the stressor layer 150. FIG. 6 shows that the gate stack 180 has enclosed the channel portion 124 of the vertical semiconductor structure 120. While not shown for clarity, the illustrated gate stack 180 can represent more than one layer. For example, the gate stack 180 may comprise a gate dielectric wrapping around the channel portion 124 and a gate electrode wrapping around the gate dielectric (not shown in FIG. 6). The gate dielectric and the gate electrode may be formed using a combination of suitable techniques. The gate dielectric layer may for example be formed by a suitable gate dielectric material such as $HfO_2$, $ZrO_2$, $Al_2O_3$ or some other high-K dielectric material. The gate dielectric layer may be deposited as a conformal thin film by any conventional deposition process, for instance by atomic layer deposition (ALD). The gate electrode may comprise one or more metals, such as an effective work function metal (EWF) in combination with a fill metal. By way of example the gate electrode may comprise one or more p-type EWF metals such as TiN, TaN, TiTaN or one or more n-type EWF metals such as Al, TiAl, TiC, or TiAlC, or compound layers such as TiN/TiAl or TiN/TaN/TiAl. Any remaining space in the cavity 174 may be filled with a fill metal such as W or Co. The method may thereafter proceed with forming source/drain contacts in a manner which per se is known in the art.

Figure 7:
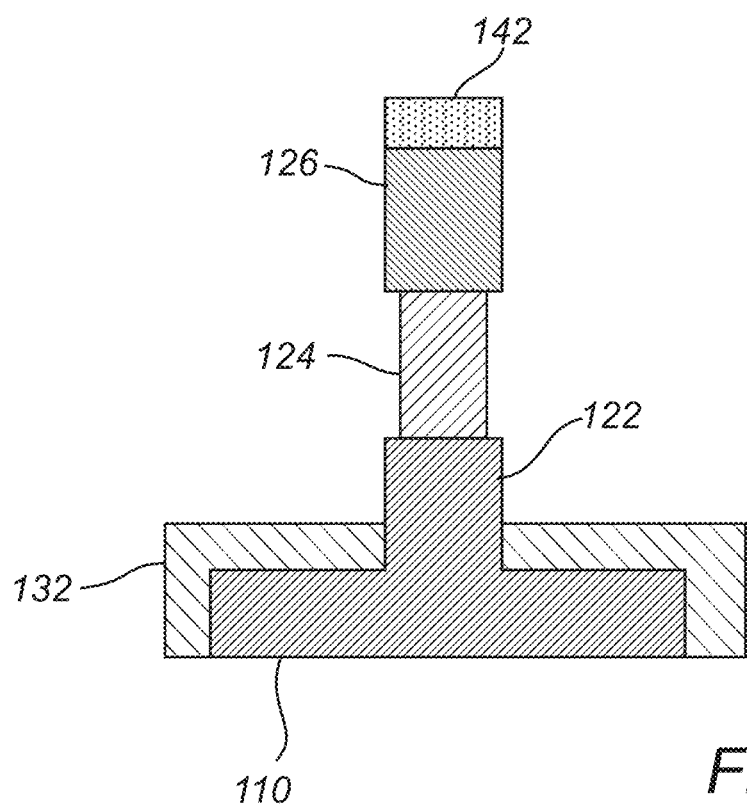
Figure 8:
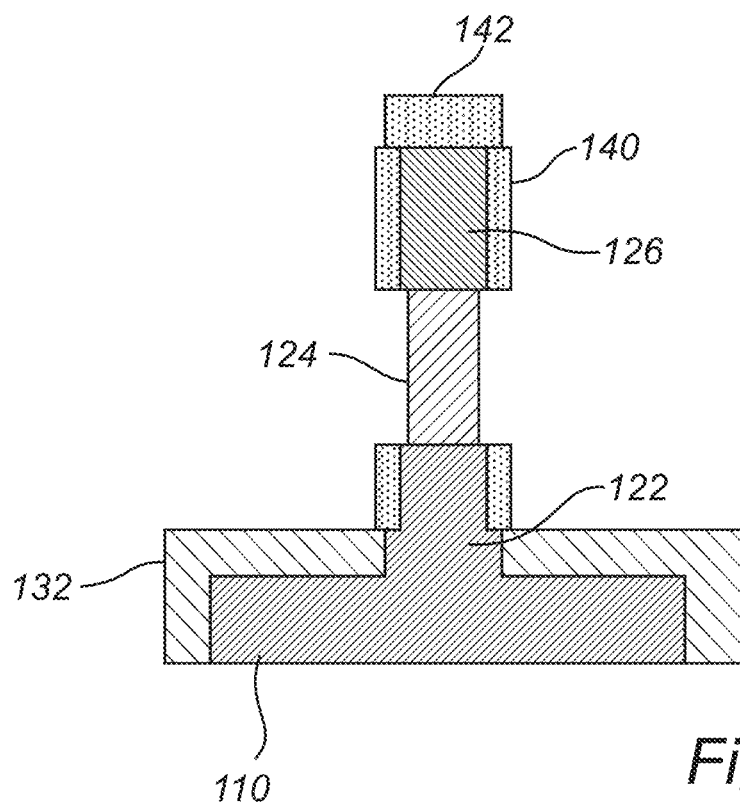
Figure 9:
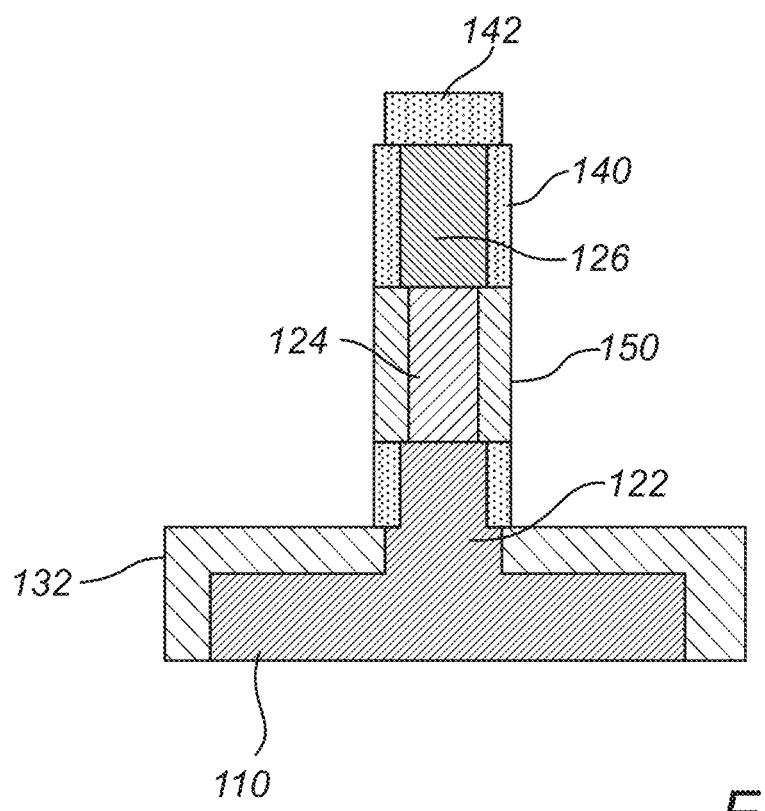

FIGS. 7-9 illustrate a method for forming a VFET device according to some other embodiments. FIG. 7 shows that a cross-sectional dimension of the channel portion 124 has been reduced, prior to forming the sacrificial structure 160. The cross-sectional dimension of the channel portion may be reduced by selective etching the channel portion 124 with respect to the upper and lower source/drain portions 126, 122 thanks to their different compositions. The selective etching of the channel portion 124 may be performed in, e.g., a wet etching process that selectively etches the channel portion 124 material with respect to the lower and upper source/drain portions 122, 126. The amount of trimming may be controlled by, e.g., controlling the etching time.

The method may thereafter proceed as shown in FIG. 8, by forming the spacer 140 on peripheral surfaces of the lower and upper source/drain portions 122, 126 of the vertical semiconductor structure 120, and then as shown in FIG. 9 by forming the stressor layer 150 on the channel portion 124 of the reduced cross-sectional dimension. The method may thereafter proceed in the same manner as shown in FIGS. 4-6 and described above.

The reduction of the cross-sectional dimension of the channel portion 124 may alternatively be performed subsequent to the formation of the spacer 140 on peripheral surfaces of the lower and upper source/drain portions 122, 126. In this way, the upper and lower source/drain portions 126, 122 may be masked by the spacer 140 during the etching of the channel portion 124. The stressor layer 150 may subsequently be formed to enclose the channel portion 124 of the reduced cross-sectional dimension, as disclosed above.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a vertical field-effect transistor device, the method comprising:
    forming on a substrate a vertical semiconductor structure protruding above the substrate and comprising a lower source/drain portion, an upper source/drain portion and a channel portion arranged between the lower source/drain portion and the upper source/drain portion;
    forming on the channel portion an epitaxial semiconductor stressor layer enclosing the channel portion, wherein the stressor layer and the channel portion are lattice mismatched;
    forming an insulating layer and a sacrificial structure, wherein the sacrificial structure encloses the channel portion with the stressor layer formed thereon, and wherein the insulating layer embeds the semiconductor structure and the sacrificial structure;
    forming in the insulating layer an opening exposing a surface portion of the sacrificial structure;
    etching the sacrificial structure through the opening in the insulating layer, thereby forming a cavity exposing the stressor layer enclosing the channel portion;
    subsequent to etching the sacrificial structure, etching the stressor layer in the cavity; and
    subsequent to etching the stressor layer, forming a gate stack in the cavity, the gate stack enclosing the channel portion of the vertical semiconductor structure.

2. The method according to claim 1, wherein forming the insulating layer comprises:
    forming a lower insulating layer portion comprising, prior to forming the sacrificial structure, embedding the lower source/drain portion at least partly and exposing the channel portion; and
    forming an upper insulating layer portion comprising, subsequent to forming the sacrificial structure, embedding the sacrificial structure and the upper source/drain portion at least partly,
    wherein the sacrificial structure is formed on the lower insulating layer portion.

3. The method according to claim 2, wherein forming the sacrificial structure comprises:
    depositing a sacrificial layer on the lower insulating layer portion; and
    patterning the sacrificial layer to define the sacrificial structure prior to forming the upper insulating layer portion.

4. The method according to claim 3, wherein forming the opening comprises forming the opening in the upper insulating layer portion.

5. The method according to claim 1, wherein the channel portion comprises $Si_{1-x}Ge_x$, and the stressor layer comprises $Si_{1-y}Ge_y$, wherein x differs from y.

6. The method according to claim 5, wherein the lower source/drain portion comprises $Si_{1-a}Ge_a$ and the upper source/drain portion comprises $Si_{1-b}Ge_b$, wherein a and b differ from x.

7. The method according to claim 6, further comprising, prior to forming the sacrificial structure, reducing a cross-sectional dimension of the channel portion by etching the channel portion selectively to the upper and lower source/drain portions.

8. The method according to claim 1, the method further comprising, prior to forming the insulating layer and the sacrificial structure, forming a spacer on peripheral surfaces of the lower and upper source/drain portions.

9. The method according to claim 8, wherein forming the spacer comprises subjecting the vertical semiconductor structure to an oxidation process, thereby forming an oxide layer on peripheral surfaces of the lower and upper source/drain portions, such that the lower and upper source/drain portions are provided with thicker oxide layer portions than the channel portion, and subsequently etching the oxide layer to expose the channel portion while preserving at least some of the oxide layer at the lower and upper source/drain portions.

10. The method according to claim 8, further comprising, subsequent to forming the spacer, reducing a cross-sectional dimension of the channel portion by etching the channel portion selectively to the upper and lower source/drain portions, and subsequently forming the stressor layer enclosing the channel portion having the reduced cross-sectional dimension.

11. A method of forming a vertical field-effect transistor device, the method comprising:
    forming a semiconductor structure extending in a vertical direction crossing a major surface of a substrate, the semiconductor structure comprising source and drain portions and a channel portion vertically interposed therebetween;
    epitaxially growing a stressor layer surrounding the channel portion and lattice mismatched to the channel portion such that the channel portion is strained to have a lattice constant different from a lattice constant of the channel portion prior to growing the stressor layer;
    surrounding each of the source and drain portions with an insulating layer;
    surrounding the channel portion having formed thereon the stressor layer with a sacrificial structure;
    removing the sacrificial structure and the stressor layer selectively against the insulating layer; and
    forming a gate stack surrounding the channel portion.

12. The method according to claim 11, wherein removing the sacrificial structure and the stressor layer comprise forming an opening through one of the insulating layers and selectively etching the sacrificial structure and the stressor layer to expose a semiconductor surface of the channel portion.

13. The method according to claim 11, wherein the channel portion comprises a silicon germanium (SiGe) and the stressor layer comprises a SiGe different from the SiGe of the channel portion.

14. The method according to claim 13, wherein the source and drain portions each comprises a SiGe different from the SiGe of the channel portion.

15. The method according to claim 11, wherein, prior to epitaxially growing the stressor layer, oxidizing the source and drain portions and the channel portion, wherein the compositions of the source and drain portions and the channel portions are such that oxides grown on the source and drain portions are thicker than an oxide grown on the channel portion.

16. The method according to claim 15, further comprising removing the oxide grown on the channel portion prior to epitaxially growing the stressor layer.

17. The method according to claim 16, wherein epitaxially growing the stressor layer comprises growing the stressor layer on a surface of the channel portion selectively against oxide surfaces the source and drain portions.

* * * * *